(12) United States Patent
Nam

(10) Patent No.: US 8,550,991 B2
(45) Date of Patent: Oct. 8, 2013

(54) TOUCH PANEL SENSOR

(76) Inventor: Dong Sik Nam, Hwaseong-si (KR)

( * ) Notice: Subject to any disclaimer, the term of this patent is extended or adjusted under 35 U.S.C. 154(b) by 79 days.

(21) Appl. No.: 13/254,807

(22) PCT Filed: Mar. 3, 2010

(86) PCT No.: PCT/KR2010/001310
§ 371 (c)(1),
(2), (4) Date: Nov. 21, 2011

(87) PCT Pub. No.: WO2010/101399
PCT Pub. Date: Sep. 10, 2010

(65) Prior Publication Data
US 2012/0056664 A1 Mar. 8, 2012

(30) Foreign Application Priority Data

Mar. 4, 2009 (KR) .................. 10-2009-0018303
Feb. 19, 2010 (KR) .................. 10-2010-0015268

(51) Int. Cl.
*A61B 1/32* (2006.01)
*H03K 17/96* (2006.01)
*H01R 43/00* (2006.01)

(52) U.S. Cl.
USPC .............................. 600/202; 327/517; 29/825

(58) Field of Classification Search
USPC ......... 600/202, 224, 217, 215, 204; 327/517, 327/516; 29/825, 622; 200/600
See application file for complete search history.

(56) References Cited

U.S. PATENT DOCUMENTS

| | | | | |
|---|---|---|---|---|
| 5,648,642 A | * | 7/1997 | Miller et al. | ............... 178/18.06 |
| 2008/0309633 A1 | | 12/2008 | Hotelling et al. | |
| 2009/0122021 A1 | | 5/2009 | Liu et al. | |
| 2009/0295752 A1 | | 12/2009 | Liu et al. | |
| 2009/0315854 A1 | | 12/2009 | Matsuo | |
| 2010/0007621 A1 | | 1/2010 | Kang et al. | |
| 2012/0199462 A1 | * | 8/2012 | Hsu | ............................... 200/600 |
| 2012/0218028 A1 | * | 8/2012 | Chu et al. | ...................... 327/517 |

FOREIGN PATENT DOCUMENTS

| | | |
|---|---|---|
| JP | 2006338668 A | 12/2006 |
| JP | 2008233976 A | 10/2008 |
| KR | 1020060131663 A | 12/2006 |
| KR | 1020070108077 A | 11/2007 |
| KR | 1020080110158 A | 12/2008 |
| KR | 1020090082965 A | 8/2009 |
| KR | 1020090098947 A | 9/2009 |
| KR | 100954894 B1 | 4/2010 |
| KR | 100962047 B1 | 6/2010 |
| KR | 1020100084255 A | 7/2010 |
| WO | 2006126604 A1 | 11/2006 |
| WO | 2008117838 A1 | 11/2008 |

OTHER PUBLICATIONS

PCT/KR2010/001310 Written Opinion and International Search Report mailed Oct. 20, 2010.

(Continued)

*Primary Examiner* — Pedro Philogene
(74) *Attorney, Agent, or Firm* — Kunzler Law Group, PC

(57) ABSTRACT

A touch panel sensor for sensing a contact position of part of body comprises a substrate, a resist electrode part including resist electrodes formed on the substrate to have a capacitance changeable according to approaching of the part of body, and a signal electrode part including signal electrodes formed on the resist electrode having resistance coefficient less than the resist electrode.

19 Claims, 20 Drawing Sheets

(56) References Cited

OTHER PUBLICATIONS

PCT/KR2011/000693 International Search Report mailed Nov. 29, 2011.

PCT/KR2011/004406 International Search Report mailed Dec. 26, 2011.

U.S. Appl. No. 13/025,005 Office Action mailed May 16, 2013.

* cited by examiner

TOUCH PANEL SENSOR

TECHNICAL FIELD

This invention relates to a touch panel sensor, more particularly, relates to a touch panel sensor which can sense a precise touch position of a finger on a flat plate.

BACKGROUND ART

FIG. 1 is a plane view illustrating an ITO thin film for a capacitive touch screen, and FIG. 2 is a plane view illustrating an operating mechanism of conventional capacitive touch screen.

Referring to FIG. 1, a conventional touch screen electrically senses a contact position of a finger. When the finger which is a kind of conductive material, locates on an electrode, electric charges can gather between the electrode and the finger. If the electric charges gather, it is possible to measure capacitance between the finger and the electrode, so as to note the finger's touch indirectly.

Not to hide a liquid crystal display or another display, the electrodes of the touch screen may be formed of transparent conductive material, such as ITO (Indium Tin Oxide).

In (a) of FIG. 1, transparent electrode patterns vertically aligned (along y-axis) are provided. The vertically aligned transparent electrode patterns are provided on a transparent film 11 made of plastic sheet or glass, and they consist of first nod patterns 12 and first connecting patterns 13 which connect the first nod patterns 12 vertically.

In (b) of FIG. 1, other transparent electrode patterns horizontally aligned (along x-axis) are provided. The horizontally aligned transparent electrode patterns provided on another transparent film 14, consist of second nod patterns 15 and second connecting patterns 16 which connect the second nod patterns 15 horizontally.

Generally the conventional touch screen may be provided by overlaying the ITO transparent sheets of (a) and (b). One example of the overlaid structure of the two transparent sheets mutually bonded is illustrated in (c) of FIG. 1.

As shown, the second nod patterns 15 and the first nod patterns 12 are positioned alternately, such that the connecting patterns connecting the first or second nod patterns intersect up and down. These connecting patterns may be electrically separated by the transparent insulating sheet.

According to the touch screen structure of (c) of FIG. 1, a signal intense passing through the electrode patterns aligned vertically and horizontally may be changed in accordance with the finger's contact position, such that the coordinates can be calculated by using the changes of the signal intense.

In detail, after deciding the x- and y-coordinates using the signal intenses 23 and 24 of the electrode patterns, the coordinates of the intersecting position 25 may be the position of the fingers contact.

In this instance, electric signal may be generated by the change of the capacitance of the transparent electrode pattern at the fingers contact position 22, to be transmitted to a controller for deciding the coordinates of the contact point. The transparent electrode patterns made of ITO (Indium Tin Oxide) are conductive, but of having high resistance in comparison with general metal.

Since the signal loss by the resistance of the electrode pattern is proportional to area and length of the electrode pattern, manufacturers have a limit to enlarge the size of the touch screens.

DISCLOSURE

Technical Problem

The present invention provides a touch panel sensor which can easily sense a weak signal so as to have an outstanding sensitivity even though using an electrode made of a relatively high resistance coefficient.

The present invention provides a touch panel sensor which can be applied to a large size of touch screen, even though using an electrode made of a relatively high resistance coefficient.

The present invention provides a touch panel sensor which has a high signal sensitivity, less limitation to enlargement of screen, less effect on transparency and clearance of a touch screen, even though using a transparent electrode made of high resistance.

Technical Solution

According to one exemplary embodiment of this invention, a touch panel sensor for sensing a contact position of part of body, comprises a substrate, a resist electrode part and a signal electrode part.

The resist electrode part includes resist electrodes formed on the substrate to have a capacitance changeable according to approaching of the part of body, and the signal electrode part includes signal electrodes formed above the resist electrode having resistance coefficient less than the resist electrode. The electric signal generated from the resist electrode part is transferred to the signal electrode part. Since the signal electrode part has a relatively low resistance, the touch panel sensor of this invention can transfer weak signals easily, and may have a large touch screen area.

The touch panel sensor may be used as a touch screen or a general touch pad. In case of being used as touch screens, the substrate may be formed using transparent synthetic material, such as polyethylene, polypropylene, acryloyl, PET and the like, and glass. The substrate may not be transparent material, in case of being used, for example, to a touch pad for notebook computer or pointing device with stylus pen.

The resist electrode part may be selected considering its optical character, similar to the substrate. Particularly, if optical character is not necessary, the resist electrode may be formed with gold, silver, aluminum and other metal or alloy, otherwise, if transparency is necessary, it may by formed with ITO or IZO (Indium Zinc Oxide).

The resist electrode may be made of transparent conductive material, such as ITO, IZO, carbon nano tube (CNT), ultra thin metal pattern (<100 Å). However, since the above materials have a high resistance coefficient rather than metal, the resist electrode made of the above materials may have an extremely high resistance, in case that the electrode is too long and narrow or the touch screen is too broad and large. But, according to this invention, metallic signal electrode part may overcome these problems.

The resist electrode part may comprise first electrode patterns provided parallel on one surface of the substrate, and the signal electrode part may comprise second electrode patterns provided perpendicular to the first electrode patterns on the same surface of the substrate, to be electrically separated from the first electrode patterns, transparent connections formed over the first electrode patterns, and a low-resist line formed on the transparent connections arranged in series, such that the low-resist line can decrease the resistance of the second electrode patterns.

In this specification, a low-resist line may be formed on transparent connections to electrically connect them. The low-resist line may be a continuous conductive line, otherwise may be discontinuously interrupted electrode lines to be arranged or scattered to electrically connect electrodes or connections.

The first electrode patterns and the second electrode patterns may be formed on the same surface of a transparent substrate, or may be formed on facing surfaces or opposite surfaces of the substrate. For example, in a case where the substrate is made of enforced glass, the electrode patterns may be formed on a bottom surface of the substrate, or in a case where another substrate is provided under a glass plate additionally, the electrode patterns may be formed on a top surface of the substrate.

The first electrode patterns may be arranged horizontally or vertically. Preferably, the first electrode patterns may include enlarged portions and bridge portions. Otherwise, the first electrode patterns may be formed in a shape of a lane having a uniform width.

Using the first electrode pattern having the enlarged portion and the bridge portion, the enlarged portion may be formed in a shape of rectangular, cube, diamond, circle or the like, which has a width relatively wider than the bridge portion. In a normal state where the objective does not approach to the touch screen, the normal capacitance may be decided by the intersection area of the bridge portion and the low-resist line. However, in the event that the objective approaches, the change of the capacitance may occur through the enlarged portions. The bridge portion may be formed with a width of about 100~300 μm.

The second electrode patterns are formed in a direction, preferably perpendicular to the first electrode patterns. Otherwise the second electrode patterns may be formed in a direction declined to the first electrode patterns, not parallel. Transparent connections may be formed in an area electrically and physically separated from the first electrode patterns, and may be connected by the low-resist line.

Since the capacitance at the cross-section between the first and second electrode patterns can be affected by the enlarged portion, the second electrode patterns may be formed over or under the first electrode patterns. Also, since an insulating layer or insulating patterns of 0.1~1.0 μm are interposed between the bridge portion and the low-resist line, the bridge portion intersecting the low-resist line may be formed with a considerably narrow width.

The low-resist line may be formed with a width less than about 30 μm, preferably less than about 10 μm, which cannot be seen by the unaided eye, and to have a considerably low resistance in comparison to conventional transparent electrodes. Moreover, the resistance of the low-resist line may be lowered by increasing its thickness. The low-resist line may be formed using gold, silver, aluminum, nickel, titanium and other metals or its alloy.

Advantageous Effects

The touch panel sensor of this invention uses a signal electrode part having a resistance coefficient less than a resist electrode part, such that the touch panel sensor transfers touch signals easily and is suitable for a large scale touch screen.

The touch panel sensor of this invention has a good signal sensitivity, transparency and clearance.

MODE FOR INVENTION

Below with reference to the attached drawings, preferred one exemplary embodiment of present invention is described in detail, but the present invention is not limited or restricted by one exemplary embodiment of the present invention. For reference, same number means same element practically, which may explain quoting the content mentioned at another drawing according to this rule, and the obvious and repeated contents are skipped accordingly.

Figure 1:
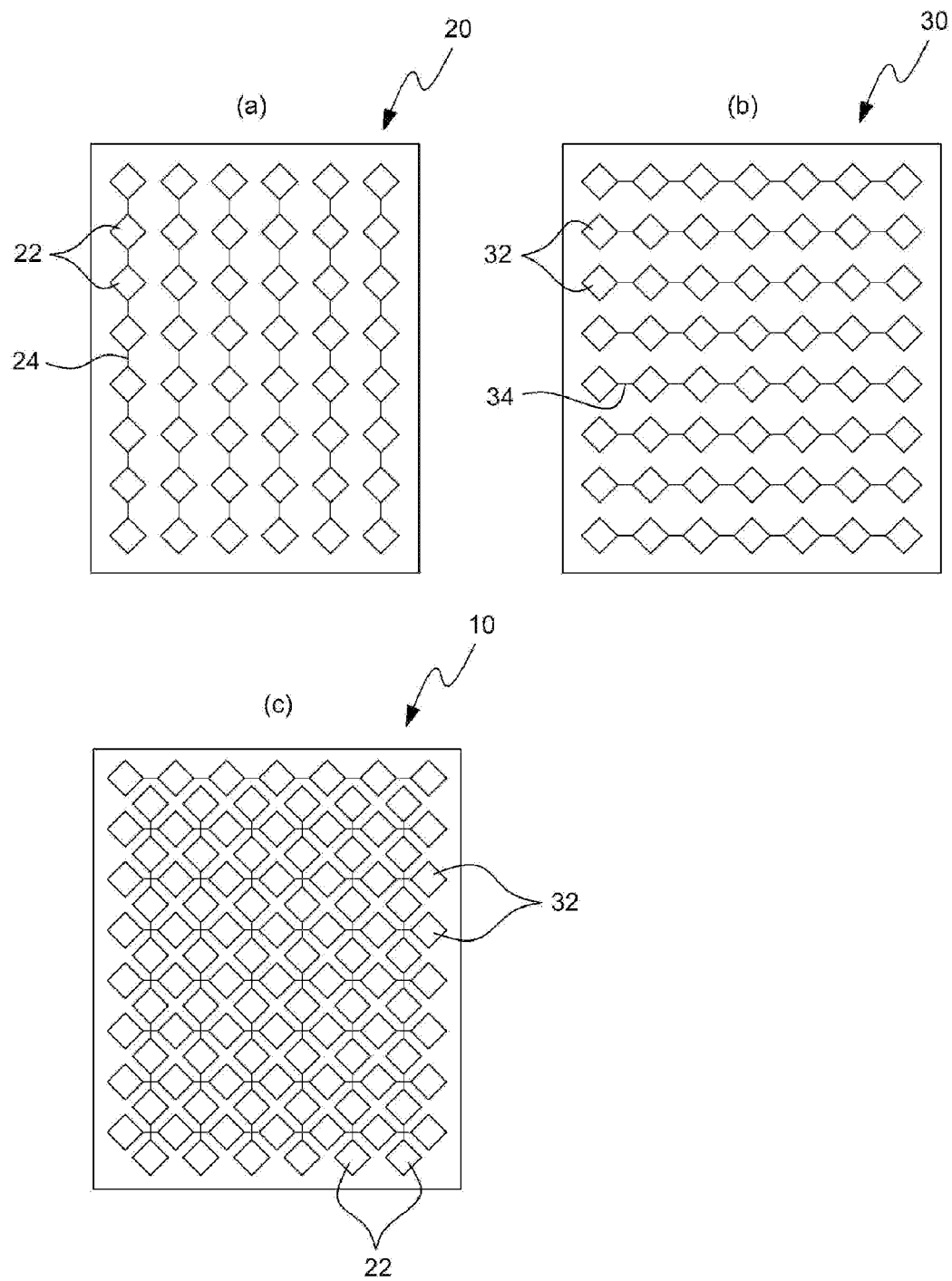
FIG. 1 is a plane view illustrating an ITO thin film for a capacitive touch screen.
Figure 2:
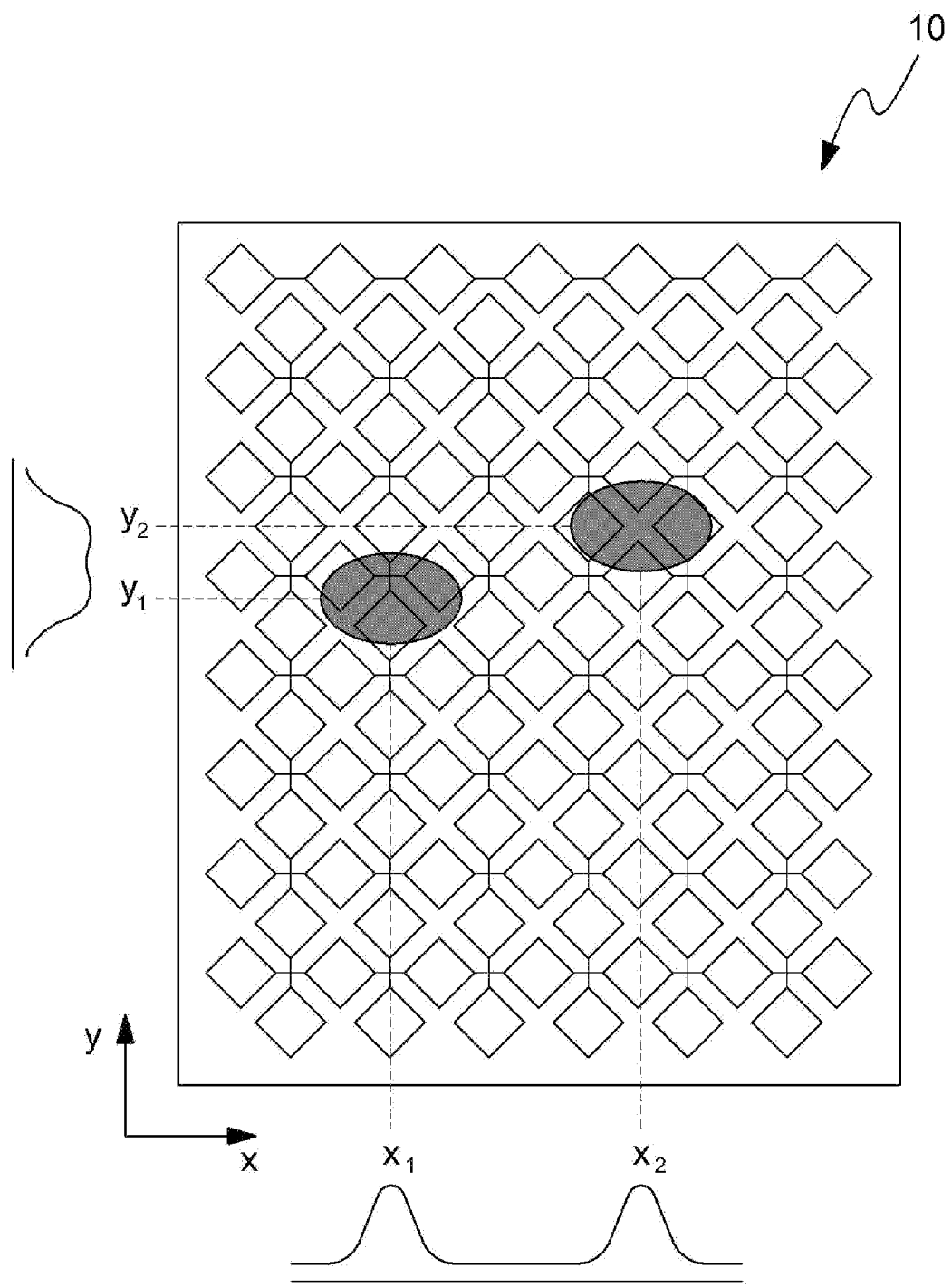
FIG. 2 is a plane view illustrating an operating mechanism of conventional capacitive touch screen.
Figure 3:
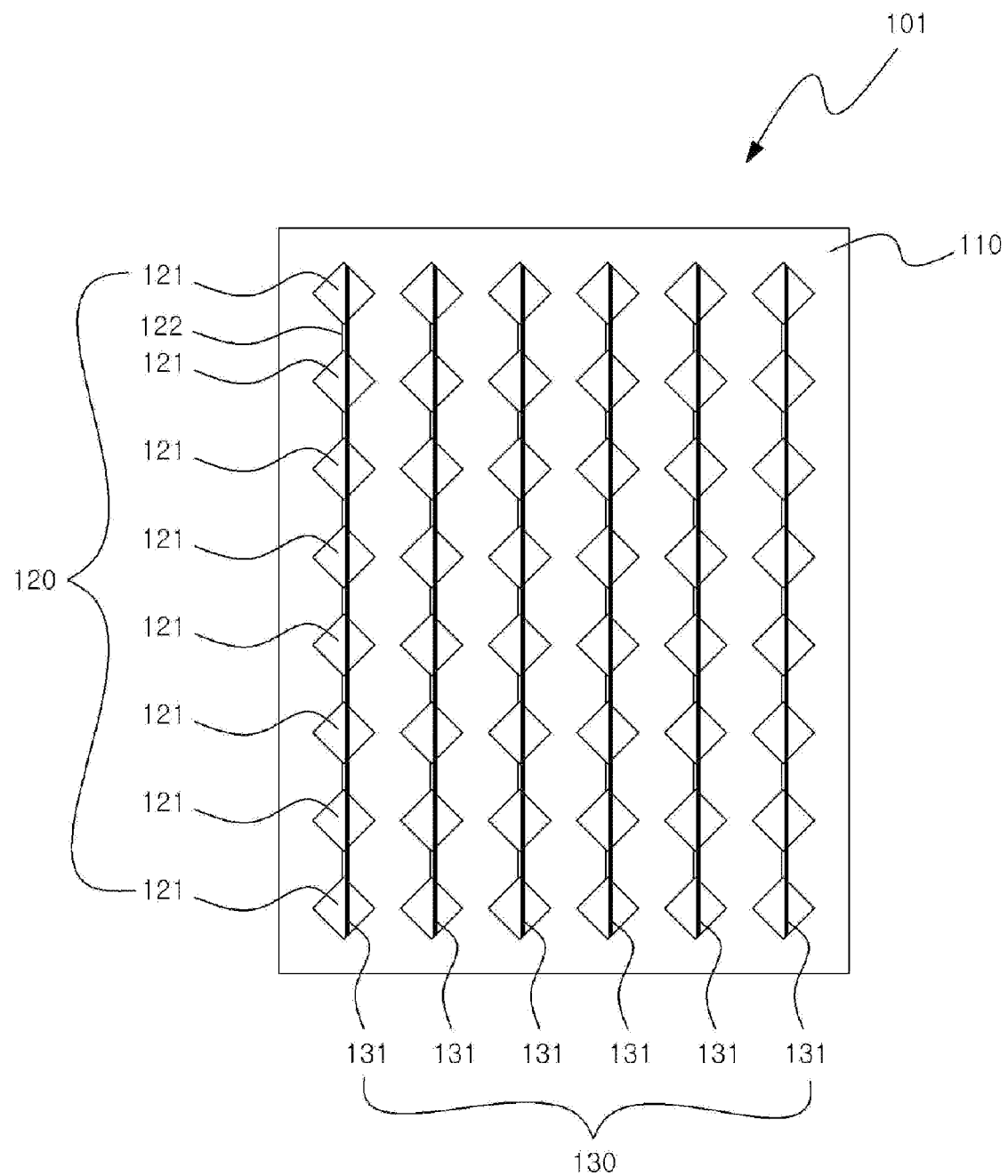
FIG. 3 is a plane view illustrating a touch panel sensor according to the first embodiment of this invention.

FIG. 3 is a plane view illustrating a touch panel sensor according to the first embodiment of this invention.

Referring to FIG. 3, a touch panel sensor comprises a transparent sheet 101, which is provided with a substrate 110, a resist electrode part 120 and a signal electrode part 130.

The substrate 110 is provided in a shape of a thin film, using insulating material such as transparent plastic sheet or glass.

The resist electrode part 120 includes resist electrodes 121 aligned vertically (along y-axis) on the substrate to have a capacitance changeable according to an approaching part of a body. The resist electrode part 120 may be formed using transparent conductive material like ITO or IZO.

The resist electrodes 121 of the resist electrode part 120 are connected vertically by connecting patterns 122. The resist electrodes 121 and the connecting patterns 122 in one row may be formed integrated as one body.

The signal electrode part 130 comprises signal electrodes 131, which is provided in a shape of a line to electrically connect the resist electrodes 121 and the connecting patterns 122 in a vertical row, formed thereon. The signal electrodes 131 may be narrower than the resist electrodes 121 and the connecting patterns 122.

The signal electrode part 130 may have a resistance coefficient less than that of the resist electrode part 120, such as gold, silver, aluminum and other metals.

The metallic signal electrode part 130 may have a high conductivity, but may hide light from an LCD monitor or other display device because metal usually blocks out light. However, if the signal electrodes are too fine, a user cannot recognize the signal electrodes and feel unchanged brightness due to a light's scattering and diffraction.

According to the present embodiment, the signal electrode part 130 is provided on the resist electrodes 121 and the connecting patterns 122 vertically aligned, in a shape of a straight line. Otherwise, the signal electrode part may be formed in a shape of a non-straight line, along a contour of the resist electrodes and in various shapes. One or more signal electrodes 131 may be provided on a set of the resist electrodes 121 and the connecting patterns 122.

The touch panel sensor of this embodiment may be produced by overlaying and adhering two of the above mentioned transparent sheets 101. For example, the touch panel sensor may be provided by overlaying two sheets, one sheet where the electrode parts are aligned vertically and the other sheet where the electrode parts are aligned horizontally. In the case of overlaying two transparent sheets 101, horizontally aligned resist electrodes and vertically aligned resist electrodes are arranged alternately and the connecting patterns of two sheets cross to be electrically separated. The signal electrode part may be provided on the resist electrodes of one sheet. In the case of forming the resist electrodes on both sides of one sheet, the signal electrode part may be provided on just one side of the sheet.

In accordance with this touch panel sensor, the resist electrode parts 120 located at touched position may have different signal reactions to recognize the coordinates (x, y) of the touched position.

According to a finger contact event, horizontally and vertically aligned resist electrode parts 120 can have changed signals, the touch panel sensor or the device can calculate x- and y-average amounts to decide the coordinates of the contact position.

Hereinafter, a manufacturing method according to this embodiment is described.

FIGS. 4 to 8 are drawings illustrating a manufacturing method according to the first embodiment of the invention.

Figure 4:
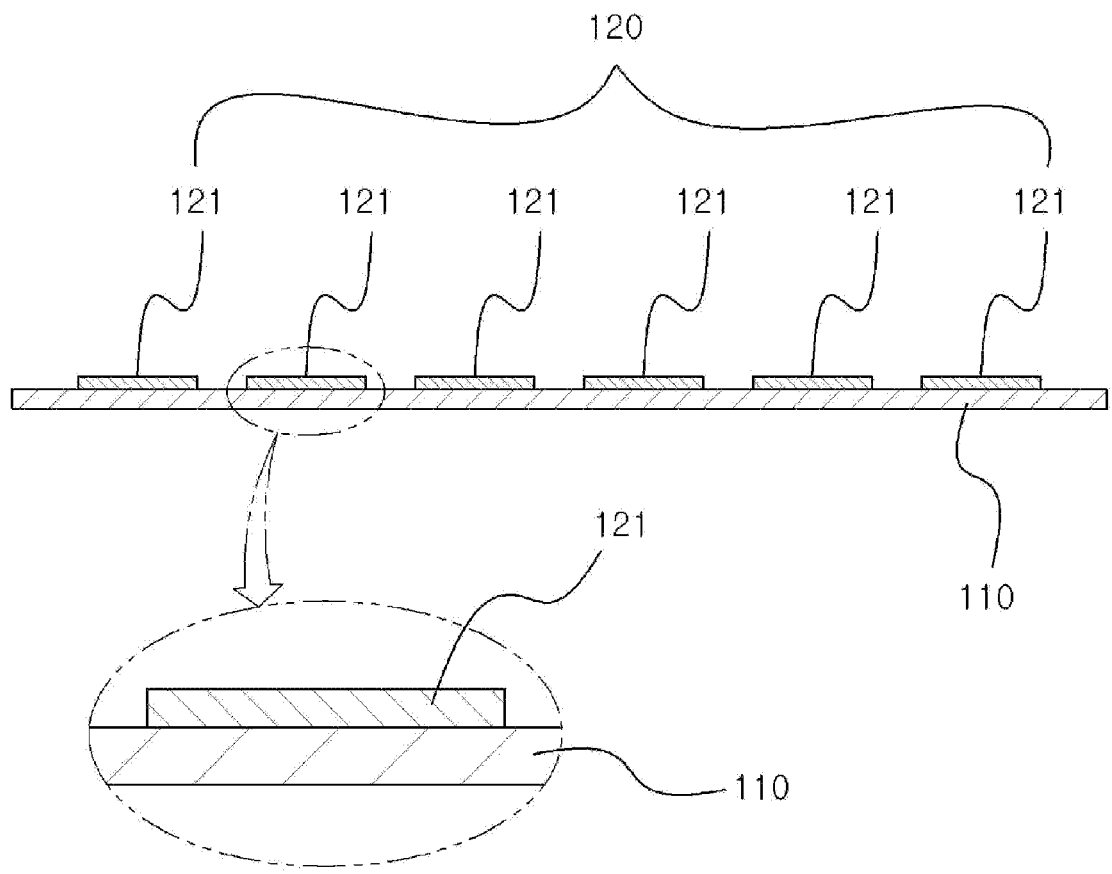
FIGS. 4 to 9 are drawings illustrating a manufacturing method according to the first embodiment of the invention.

At first, referring to FIG. 4, the resist electrode part 120 including the resist electrodes 121 is formed on the substrate 110.

After forming a transparent conductive layer, with ITO or IZO, on the substrate 110, the resist electrode part 120 can be treated by photoresist and etching processes to form the patterns shown in FIG. 4.

Figure 5:
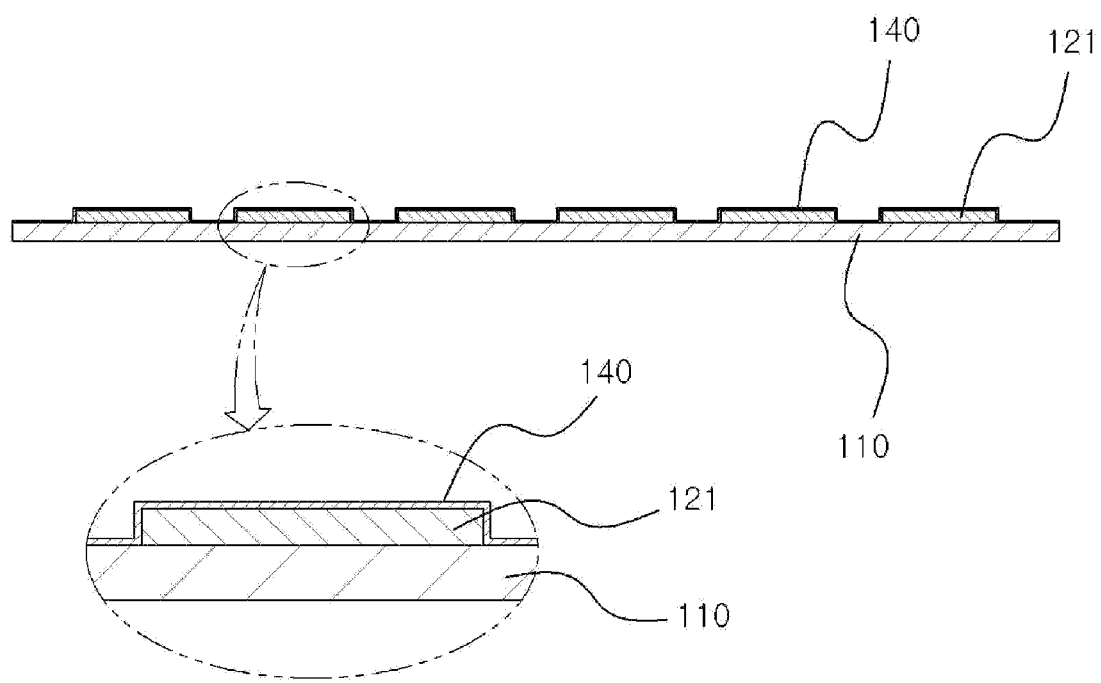

And then, as shown in FIG. 5, a thin metal layer 140 is formed on the substrate 110 where the resist electrode part 120 is formed.

Figure 6:
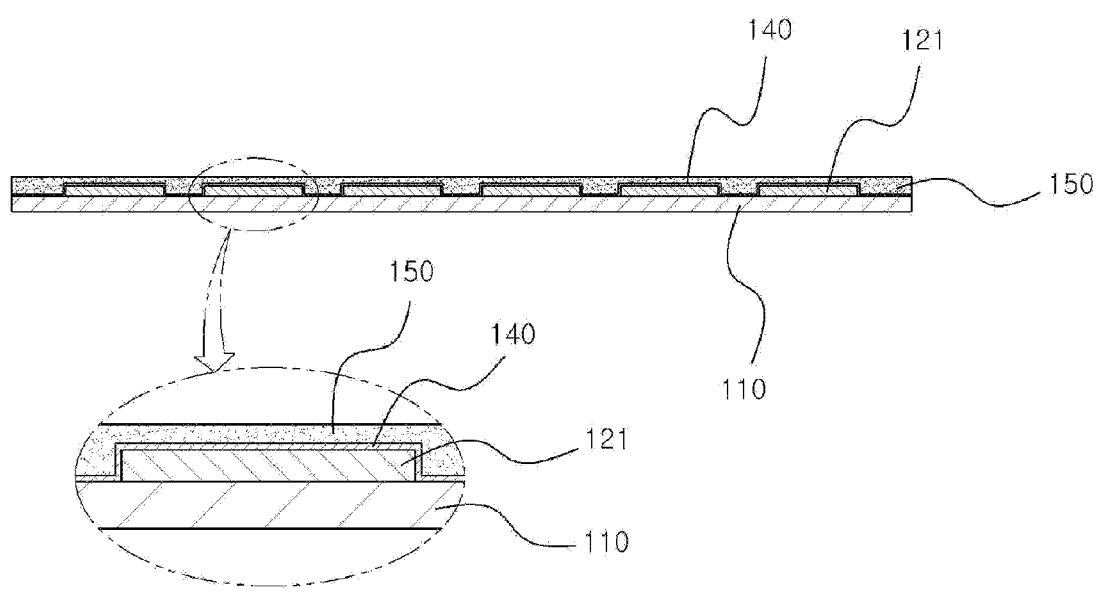

And then, as shown in FIG. 6, a photoresist layer 150 is formed on the thin metal layer 140. The photoresist layer 150 may be treated by patterning process.

Figure 7:
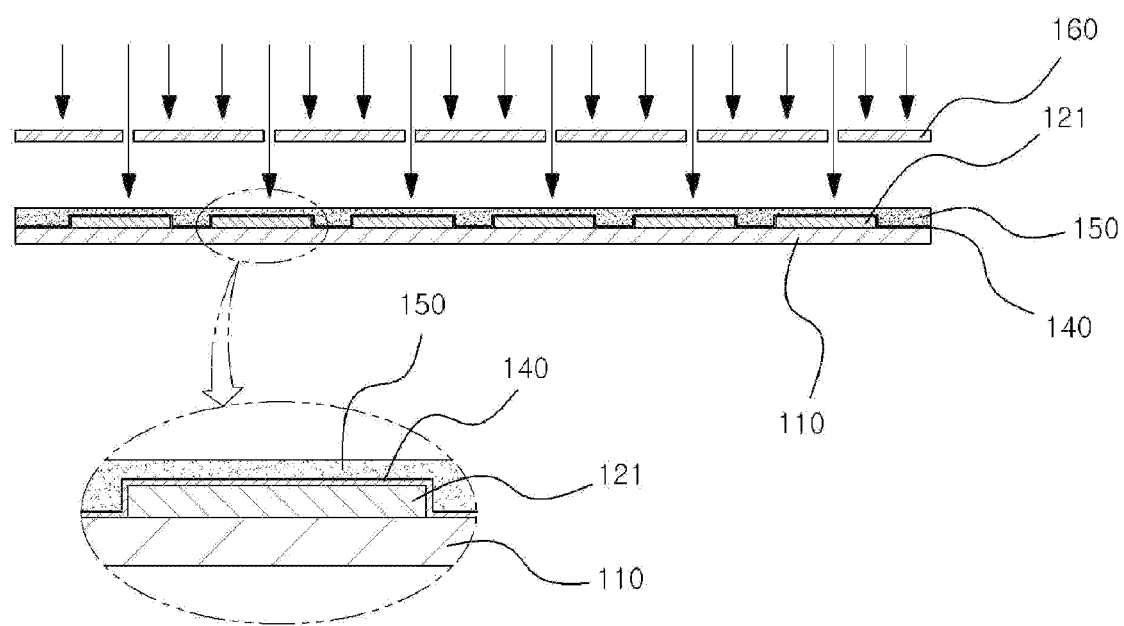
Figure 8:
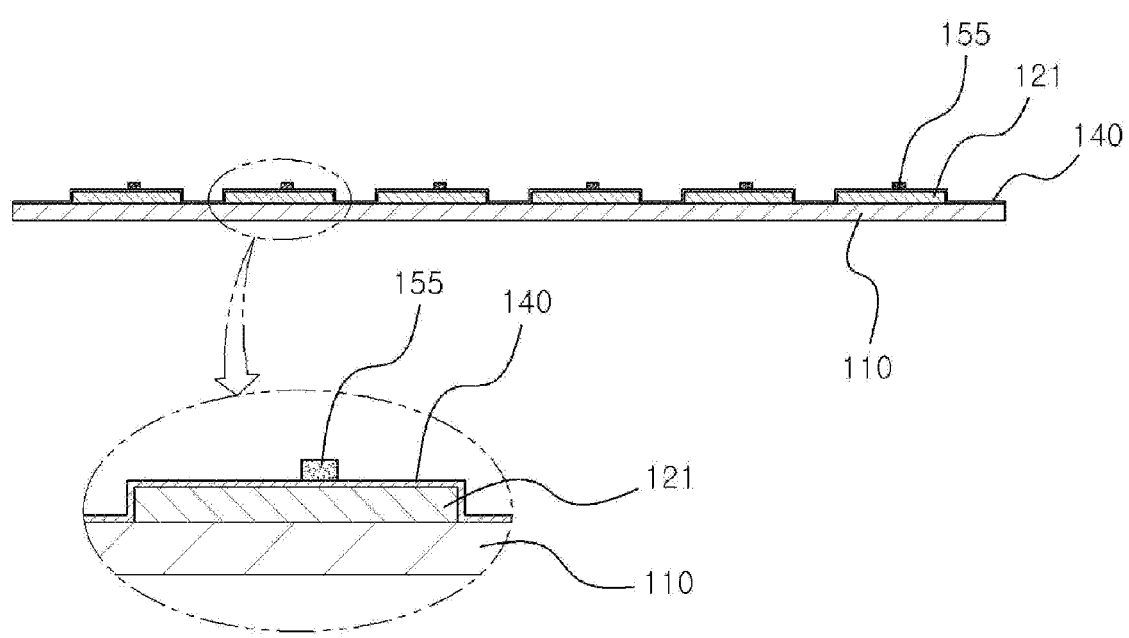

Referring to FIG. 7, the photoresist layer 150 may be a positive type and be exposed to light, such as laser, passing through a mask 160. Part of the photoresist layer 150 not exposed to light may be removed to form a photoresist pattern 155 as shown in FIG. 8.

Figure 9:
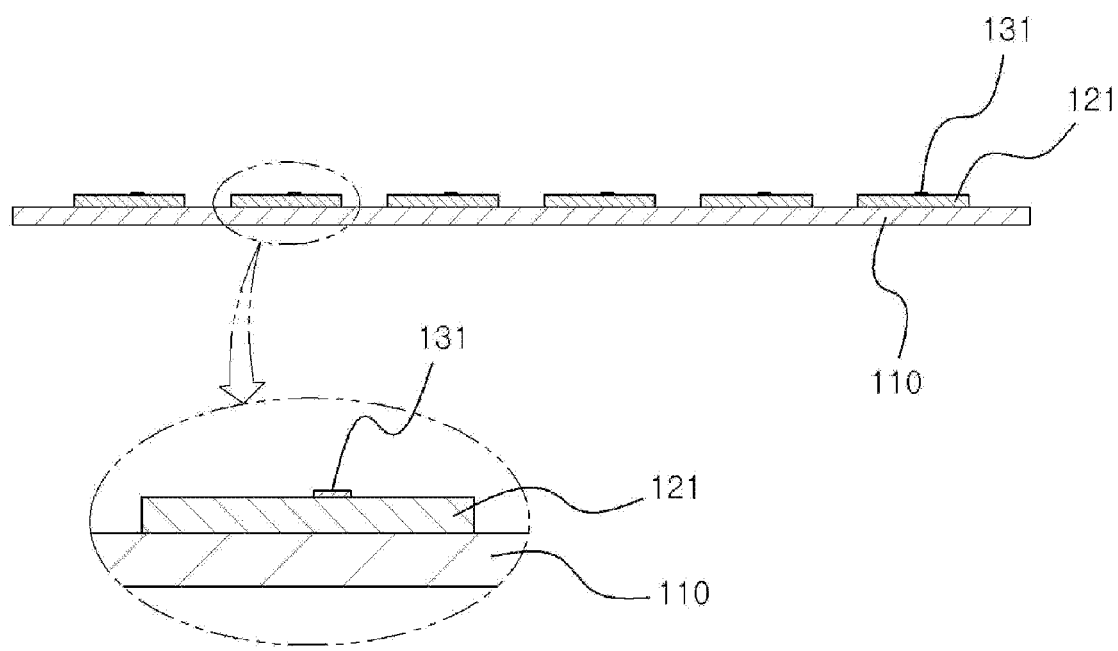

By etching, part of the metal layer 140 exposed through the photoresist pattern 155 may be removed. After removing the photoresist pattern 155, the signal electrode part 130 may be formed as shown in FIG. 9.

Figure 10:
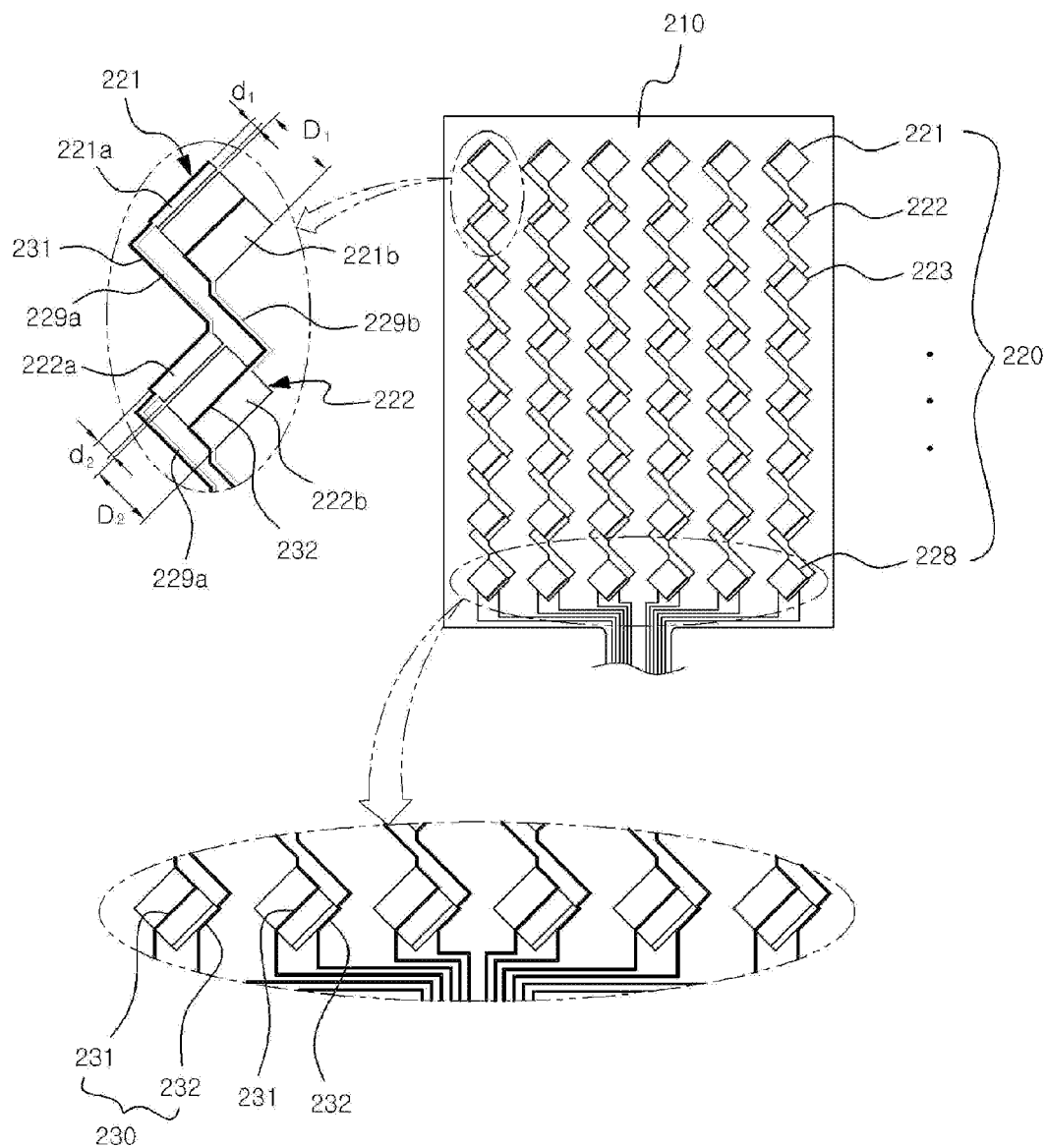
FIG. 10 is a plane view illustrating a touch panel sensor according to the second embodiment of this invention.

FIG. 10 is a plane view illustrating a touch panel sensor according to second embodiment of this invention.

Referring to FIG. 10, a touch panel sensor comprises a sheet 210, a resist electrode part 220 including vertical nod patterns 221~228 formed on the sheet 210, and a signal electrode part 230 including signal electrodes 231 and 232 formed on the vertical nod patterns 221~228. The vertical nod patterns 221~228 are aligned vertically, and about 6 lines of the vertical nod patterns are provided on the sheet.

The vertical nod patterns 221~228 have a first nod pattern 221a (or 222a) and a second nod pattern 221b (or 222b). Along a vertical line, the vertical nod patterns 221~228 may be provided in a shape of diamond or cube, and each of the vertical nod patterns 221~228 may be divided into the first nod pattern and the second nod pattern. For example, from up to down, the area ratios of the first nod patterns and the second nod patterns may be varied, such as (1:8), (2:7), (3:6), (4:4), (5:4), (6:3), (7:2), (8:1).

The first nod patterns 221a and 222a are connected by a first connecting pattern 229a, and the area of the first nod patterns, from up to down, increase by steps. Oppositely, the second nod patterns 221b and 222b are connected by a second connecting pattern 229b, and the area of the second nod patterns, from up to down, decrease by steps.

The sheet 210 of this embodiment may be formed using transparent synthetic material, such as polyethylene, polypropylene, acryloyl, PET and the like, and glass. Otherwise, the sheet may not be a transparent material, in the case of being used, for example, for a touch pad for notebook computer or pointing device with stylus pen.

The material for the vertical nod patterns 221~228 may be selected variously. For example, according to this embodiment, the vertical nod patterns are made of ITO or IZO. But, the resist electrode part may be formed using other conductive material, such as gold, silver, aluminum and the like.

In the vertical nod patterns, the first nod patterns 221a and 222a are mutually connected, and the second nod patterns 221b and 222b are mutually connected.

The signal electrodes 231 and 232 of the signal electrode part 230 are formed on the vertical nod patterns 221 to 228 vertically arranged to connect the vertical nod patterns 221 to 228. Particularly, one of the signal electrodes 231 is formed on the first nod patterns 221a and 222a and the first connecting pattern 229a, and the other of the signal electrodes 232 is formed on the second nod patterns 221b and 222b and the second connecting pattern 229b.

The signal electrodes 231 and 232 are narrower than the first and the second nod patterns, and also narrower than the first and second connecting patterns 229a and 229b.

The signal electrodes 231 and 232 are formed using conductive material having a resistance coefficient less than the resist electrode part 220, made of ITO or IZO. The signal electrodes 231 and 232 may be formed using gold, silver, aluminum and the like.

Although the signal electrodes 231 and 232 are not transparent, they are extremely fine compared to the nod patterns and the connecting patterns, so as to be applied to a transparent touch screen and take no effect to transparency and clearance.

Since the electric signal is transmitted via the signal electrodes 231 and 232 having a low resistance rather than the resist electrode part 220, the signal sensitivity of the touch panel sensor of this embodiment is very excellent.

Since the signal electrodes 231 and 232 transmit the signal, the touch screen according to the present invention can be freely enlarged.

Hereinafter, described are processes to calculate x-coordinate using the vertical nod patterns 221 to 228.

Referring to FIG. 10, provided are 6 lines of the vertical nod patterns 221 to 228 vertically connected. The x-coordinate can be calculated by a math equation $\{(n1*1)+(n2*2)+\sim(nk*k)\}/(n1+n2+\sim nk)$, wherein k is a number of the nod patterns and nk is a sum of the signal intensity at the first and second nod patterns according to k line.

In the case that a signal intensity of the first nod pattern of 4th line is 60, a signal intensity of the first nod pattern of 5th line is 70, a signal intensity of the first nod pattern of the other lines is 0, a signal intensity of the second nod pattern of 3rd line is 80, a signal intensity of the second nod pattern of 4th line is 100, and a signal intensity of the second nod pattern of 5th line is 90, x-coordinate can be calculated using the math equation, particularly x-coordinated in this situation is 4.2 (={(80*3)+(160*4)+(160*5)}/(80+160+160)).

Besides, after calculating x-coordinates of the first nod patterns and the second nod patterns respectively, a final x-coordinate can be calculated on an average of the pre-calculated x-coordinates. For example, one exemplary equation may be $\frac{1}{2}\{(\Sigma n1k*k)/(\Sigma n1k)+(\Sigma n2*k)/(\Sigma n2k)\}$, wherein k is a line number of the nod patterns, and n1k and n2k are signal intensities at the first and second nod patterns according to k line.

Hereinafter, described are processes to calculate y-coordinate using the vertical nod patterns 221 to 228.

The y-coordinate of the finger contact position can be decided by comparing the signal result measured via the first nod pattern and the second nod pattern, which form a pair. For reference, when a finger makes contact with the first and the second nod patterns simultaneously, the signal intensity transferred to a controller is proportional to the size of the contact area.

To calculate the y-coordinate, it is supposed that the finger contact area and signal intensity at the first nod pattern is A(y) and C(y) respectively and the finger contact area and signal intensity at the second nod pattern is B(y) and D(y) respectively.

The signal intensity transmitted from the first and second nod patterns to the controller are proportional to A(y) and B(y) respectively, to form an equation A(y)/B(y)=C(y)/D(y).

The controller or the device calculates C(y)/D(y), compares it with A(y)/B(y), and determines the amount of y by referring to a table. For example, the table can be defined that if y (0<y<1) is 0.5, A(0.5)/B(0.5) can be 1, if y is 1.0 (at top point), A(1)/B(1) can be ⅛, and if y is zero (at bottom point), A(0)/B(0) can be 8. Using the prepared table, the y-coordinate can be calculated from A(y)/B(y).

According to the above example, supposing that a signal intensity of the first nod pattern of 4th line is 60, a signal intensity of the first nod pattern of 5th line is 70, a signal intensity of the first nod pattern of the other lines is 0, a signal intensity of the second nod pattern of 3rd line is 80, a signal intensity of the second nod pattern of 4th line is 100, a signal intensity of the second nod pattern of 5th line is 90, a signal intensity (C(y)) of the first nod patterns is 130, and a signal intensity (D(y)) of the second nod patterns is 190, C(y)/D(y) is approximately 0.68.

According to one exemplary table, when A(y)/B(y) is 0.68, y can be 0.65. In the case that the vertical length of a touch panel sensor is 100 mm, y-coordinate can be calculated as about 65 mm.

Figure 11:
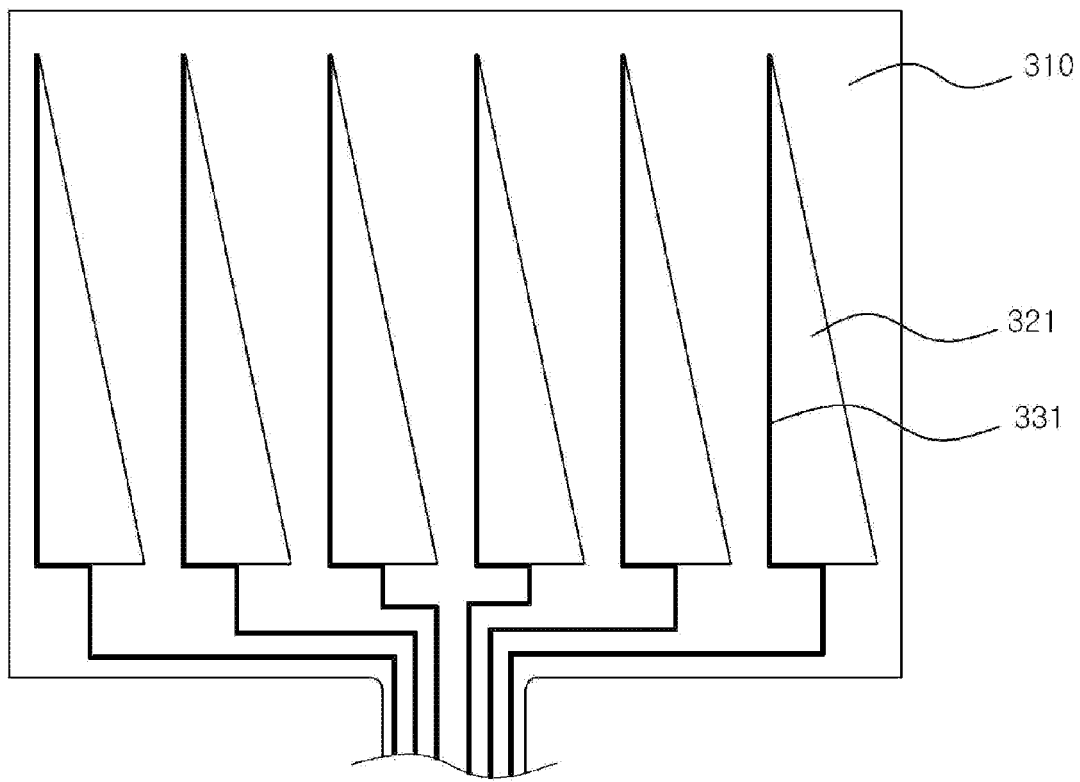
FIG. 11 is a drawing illustrating a touch panel sensor according to the third embodiment of this invention.

FIG. 11 is a drawing illustrating a touch panel sensor according to the third embodiment of this invention.

Referring to FIG. 11, the touch panel sensor according to the third embodiment may be similar to the touch panel sensor according to the second embodiment. Thus, the description for the touch panel sensor of the third embodiment can refer the description and drawings for the touch panel sensor of the second embodiment, and repeated matters can be skipped.

But a resist electrode part 320 of the third embodiment is different from the resist electrode part 220 of the second embodiment.

Referring to FIG. 11, resist electrodes 321 included in the resist electrode part 320 are arranged on a substrate 310 parallel in one direction, and each of the resist electrodes 321 has a tapering shape.

Particularly, each of the resist electrodes 321 is formed in a right-triangle shape, and the resist electrodes 321 are arranged horizontally and uniformly.

A signal electrode part includes signal electrodes 331 formed on the resist electrodes 321.

The substrate 310 is formed using transparent material, and the resist electrodes 321 are formed using ITO, IZO and the like for a touch screen.

The signal electrodes 331 are formed along an edge of the resist electrode and in a shape of a fine and uniform line.

The signal electrodes 331 may be formed using a low resistance material less than the resist electrode part 320, such as gold, silver, aluminum and the like.

Although the signal electrodes 331 are not transparent, they are provided in a fine line shape, so as to be applied to a transparent touch screen and take no effect to transparency and clearance.

Since the electric signal is transmitted via the signal electrodes 331 having a low resistance rather than the resist electrode part 320, the signal sensitivity of the touch panel sensor of this embodiment is very excellent.

Since the signal electrode 331 transmits the signal, the touch screen according to this embodiment can be freely enlarged.

For reference, since the width of the resist electrode part 320 is gradually changed, the change of the capacitance is different in accordance with the finger's contact point to be used to calculate y-coordinate. The resist electrode 321 having a changed capacitance can be used to calculate x-coordinate.

Figure 12:
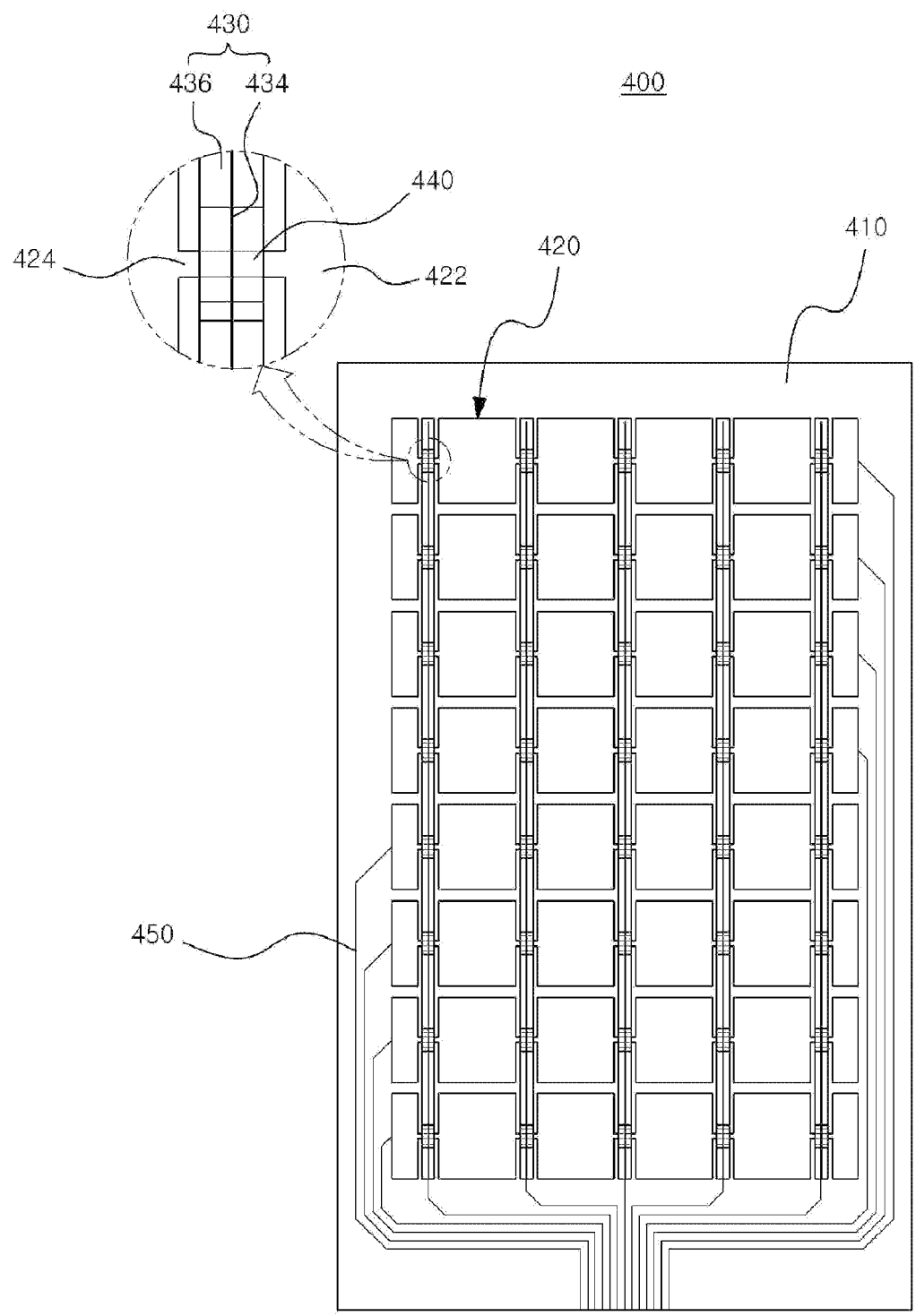
FIG. 12 is a plane view illustrating a touch panel sensor according to the fourth embodiment of this invention.
Figure 13:
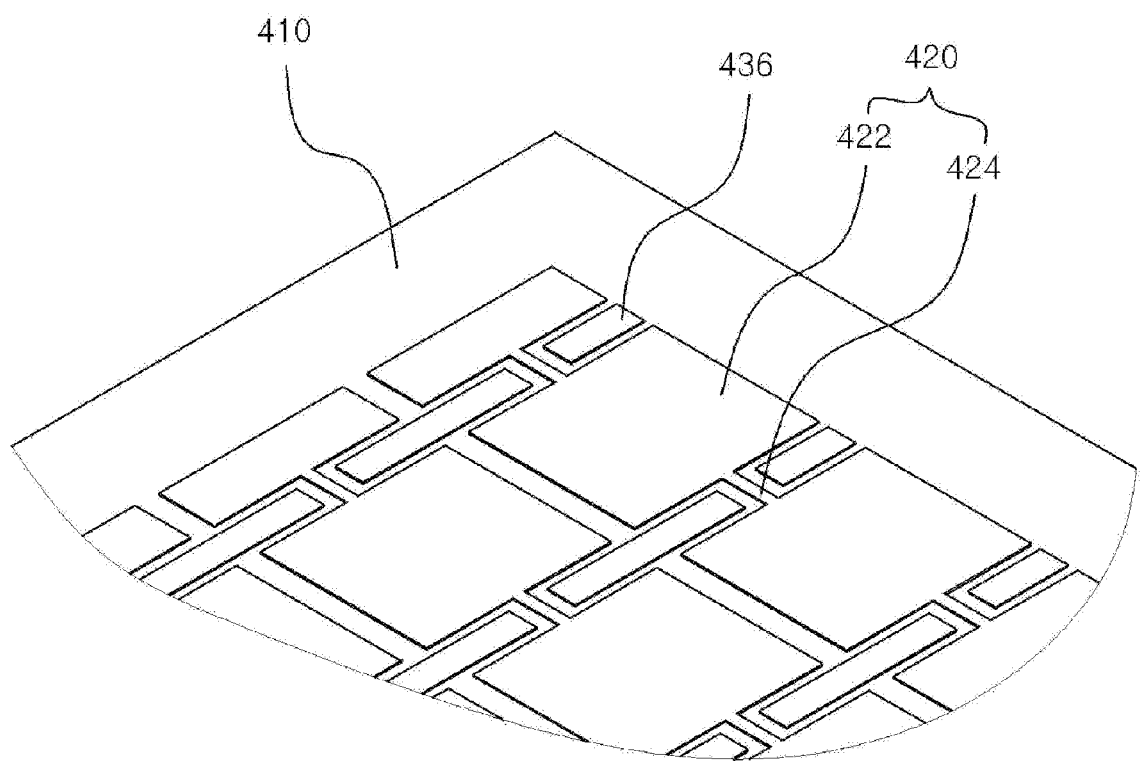
FIGS. 13 to 15 are partially enlarged perspective views illustrating a manufacturing method of the touch panel sensor of FIG. 12.
Figure 14:
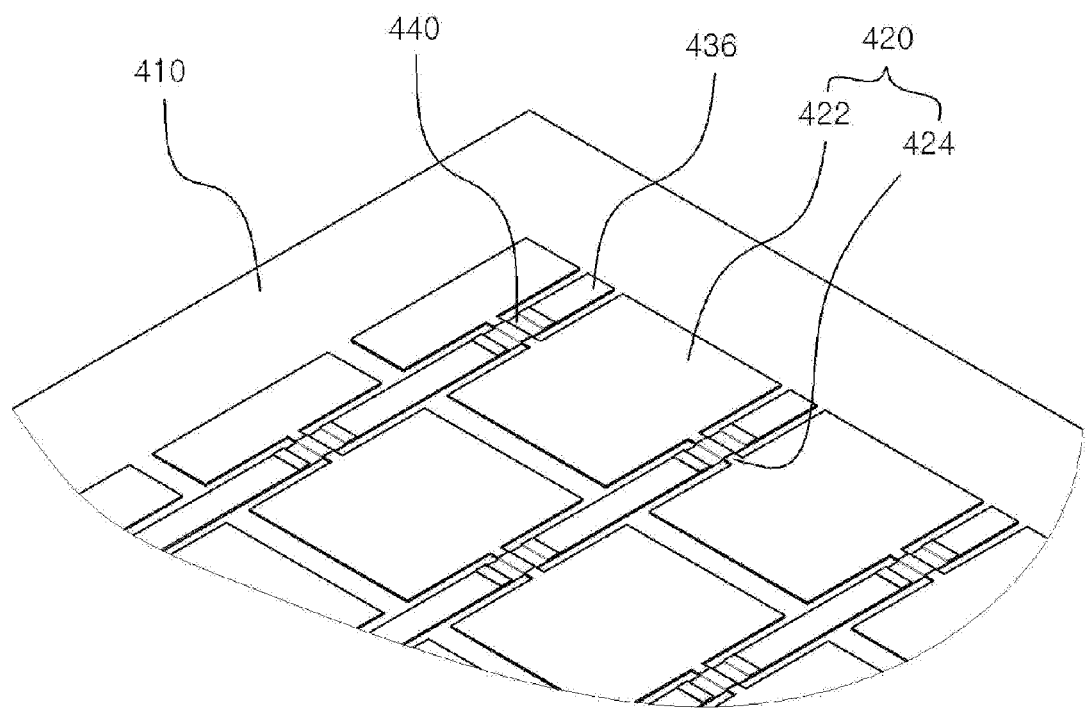
Figure 15:
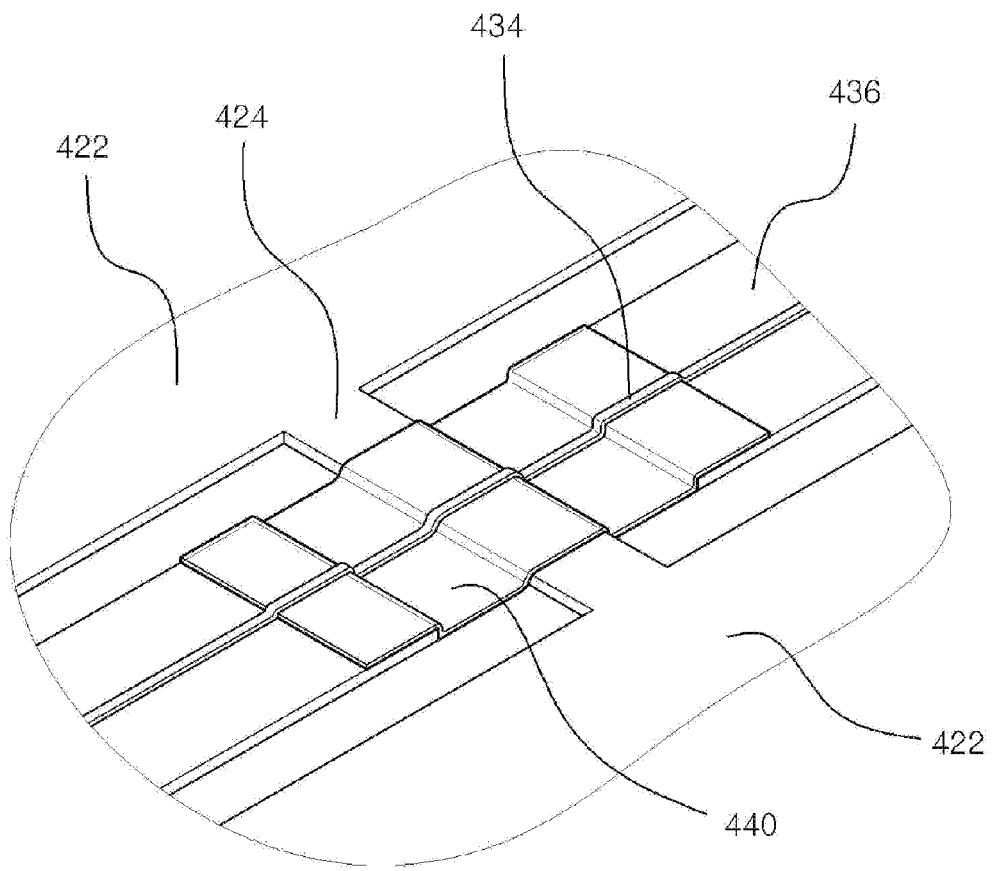

FIG. 12 is a plane view illustrating a touch panel sensor according to the fourth embodiment of this invention. FIGS. 13 to 15 are partially enlarged perspective view illustrating a manufacturing method of the touch panel sensor of FIG. 12.

Referring to FIGS. 12 to 15, a touch panel sensor 400 according to the present embodiment comprises a transparent substrate 410, first electrode patterns 420 and second electrode patterns 430 formed on the substrate 410, and insulating patterns 440 interposed between the first electrode patterns 420 and the second electrode patterns 430.

The substrate 410 may be formed using synthetic film, such as PET, PC, PE and the like, and glass substrate. The substrate 410 may be installed on a display, like an LCD or LED display module, or otherwise may be applied directly to a transparent sheet or film composing the LCD or LED display module. In this specification, the transparency of the transparent substrate 410 can mean a little opaque state that does not prevent display function, besides perfectly clear state.

The first electrode patterns 420 and the second electrode patterns 430 may be formed on one or both of the top side and bottom side of the substrate 410. For example, in case of synthetic film the both electrode patterns may be formed on a top side of the film, however, in case of glass substrate they may be formed on a bottom side of the glass substrate.

The first electrode patterns 420 may be formed using transparent conductive material, such as ITO, IZO or carbon nano tube (CNT), and may be provided in a shape of line patterns arranged parallel on the substrate 410, horizontally or vertically. For example, the first electrode patterns 420 may include enlarged portions 422 and bridge portions 424 provided alternately in series. The enlarged portions 422 and the bridge portions 424 aligned alternately in one row, may be formed using the same or different material.

The enlarged portions 422 have a width relatively or considerably wider than the bridge portions 424, and the bridge portions 424 is located between every enlarged portions 422 to electrically connect the enlarged portions 422. For example, in a device having about 3.0 inch display and touch area, the bridge portions 424 may be formed with a width of about 0.1~0.2 mm and the enlarged portions 422 may be formed with a width of about 4~6 mm. In this instance, the enlarged portions 422 have a width of about 20~60 times wider than the bridge portions 424.

The enlarged portions 422 and the bridge portions 424, as shown in drawings, may be formed in rectangular shape, otherwise may be formed in diamond, circle or oval. The enlarged portions 422 and the bridge portions 424 may be formed with the same material or on the same surface together with transparent connections 436, and may be formed in various shapes as long as they are electrically separated from each other. In a device, the display under the touch panel sensor 400 can generate electromagnetic interference (EMI), but if the electrode patterns 420 and 430 and the transparent connections 436 are separated by a minimum distance, they can reduce the EMI.

The second electrode patterns 430 may partially overlay the first electrode patterns 420. The second electrode patterns 430 may be formed over or under the first electrode patterns 420 to be electrically separated from the first electrode patterns 420. To separate them, an insulating layer or insulating patterns 440 may be formed between the first and the second electrode patterns 420 and 430.

The insulating patterns 440 may be formed using insulating material, such as $SiO_2$, $Si_3N_4$ or $TiO_2$, and may be formed by vaporization, sputtering, applying, spraying, laminating, adhesion, printing and the like. As shown in drawings, the insulating patterns 440 may be provided indirectly by patterning process after vaporization or sputtering, otherwise, may be provided directly by printing without patterning. The insulating patterns 440 may be provided as one insulating layer. As shown in FIG. 14, after the enlarged portions 422, the bridge portions 424 and the transparent connections 436 are patterned, the insulating patterns 440 may be formed by another patterning process.

The second electrode patterns 430 include the transparent connections 436 and a low-resist line 434. The transparent connections 436 may be formed with the first electrode patterns 420 simultaneously. The transparent connections 436 may be formed with transparent conductive material to have a width of about 0.1~0.2 mm, which can be formed by a photoresist process etching ITO layer, together with the enlarged portions 422 and the bridge portions 424.

As shown in FIG. 15, the low-resist line 434 is formed on the insulating patterns 440, and passes top surfaces of the transparent connections 436 to electrically connect the transparent connections 436. The low-resist line 434 may be formed using metal like gold, silver, aluminum or chrome, or may be formed by a patterning process after vaporization or sputtering, or may be formed by a printing process like silkscreen or inkjet. The low-resist line 434 may be formed with a width less than about 30 μm, preferably less than about 10 μm, not to be seen by unaided eye.

The low-resist line 434 may be formed in the shape of a straight line, or otherwise may be formed in the shape of a curved line or a folded line, and may be changed regularly or irregularly. In the case that the low-resist line 434 is formed in a shape of an irregularly curved or folded line, it cannot be seen from outside.

The low-resist line 434 may be formed together with wire patterns 450 located at a bezel area. The wire patterns 450 of the bezel area are focused on one side of the transparent substrate 410 to be connected to FPCB. Since the wire patterns 450 are formed with metal, it can be formed simultaneously with the low-resist line 434.

Figure 16:
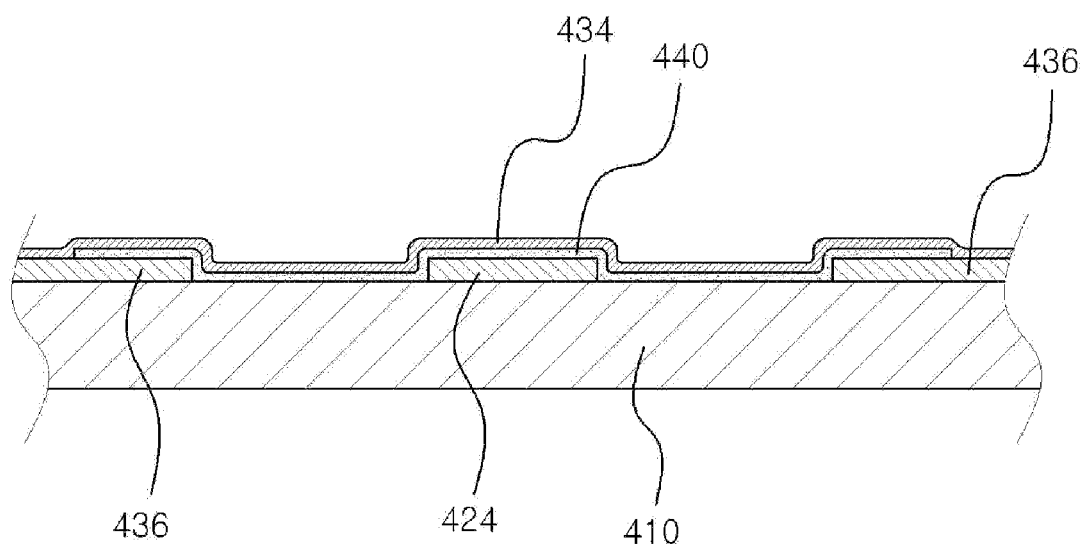
FIG. 16 is a sectional view illustrating an overlaid structure of the touch panel sensor of FIG. 12.

FIG. 16 is a sectional view illustrating an overlaid structure of the touch panel sensor of FIG. 12.

Referring to FIG. 16, the low-resist line 434 formed with metal is provided on the transparent substrate 410, the bridge portions 424 and the insulating patterns 440.

For reference, since the transparent conductive material like ITO has an area resistance of about 2500/square, the transparent material of a width of about 100~300 μm and a length of about 6~8 cm may have a resistance of several hundred ohm. Thus conventional ITO electrodes are not proper to a large scale display because of extremely high resistance. However, since the metallic low-resist line 434 is formed with metal, it can reduce the total resistance of the second electrode patterns 430, to improve the sensor's sensitivity.

In a normal state where the finger does not approach the touch screen, the normal capacitance may be decided by the intersection area of the bridge portion 424 and the low-resist line 434. For reference, in conventional touch panel sensor using only ITO electrodes, between ITO films is interposed an optical clearance adhesive (OCA) film having a thickness of about 200 μm to form a capacitance. However, the bridge portions 424 and the low-resist line 434 are separated by a gap of about 0.1~1.0 μm through the insulating patterns 440, so as to form a capacitance of about 200~1000 times larger than the conventional touch panel sensor. By controlling the cross area of the bridge portion 424 and the low-resist line 434, the normal capacitance may be properly selected.

Since the cross area of the bridge portions 424 and the low-resist line 434 is relatively small, the second electrode patterns 430 may be located below the first electrode patterns 420.

Moreover, the low-resist line 434 may have less resistance by increasing its thickness, without affecting the transparency of the touch screen. Namely, the low-resist line of this embodiment can control the resistance freely without damaging transparency and clearance.

The low-resist line 434 of this embodiment is shaped of a straight line, however, it can be shaped of a regularly or irregularly curved line or folded line not to be seen by unaided eye.

The low-resist line 434 may further have optical absorption. In case of forming a minute dark or anti-reflection pattern on the low-resist line 434, for example with carbon/titanium (Cu/Ti), molybdenum (Mo), chrome (Cr), black chrome and the like. Otherwise, the low-resist line itself may be made of a dark metal, such as Cu/Ti, Mo, Cr and the like.

According to the present embodiment, the low-resist line 434 is formed on a top side of the first electrode patterns 420 and the transparent connections 436. Alternatively the low-resist line may be formed on a bottom side of them.

Figure 17:
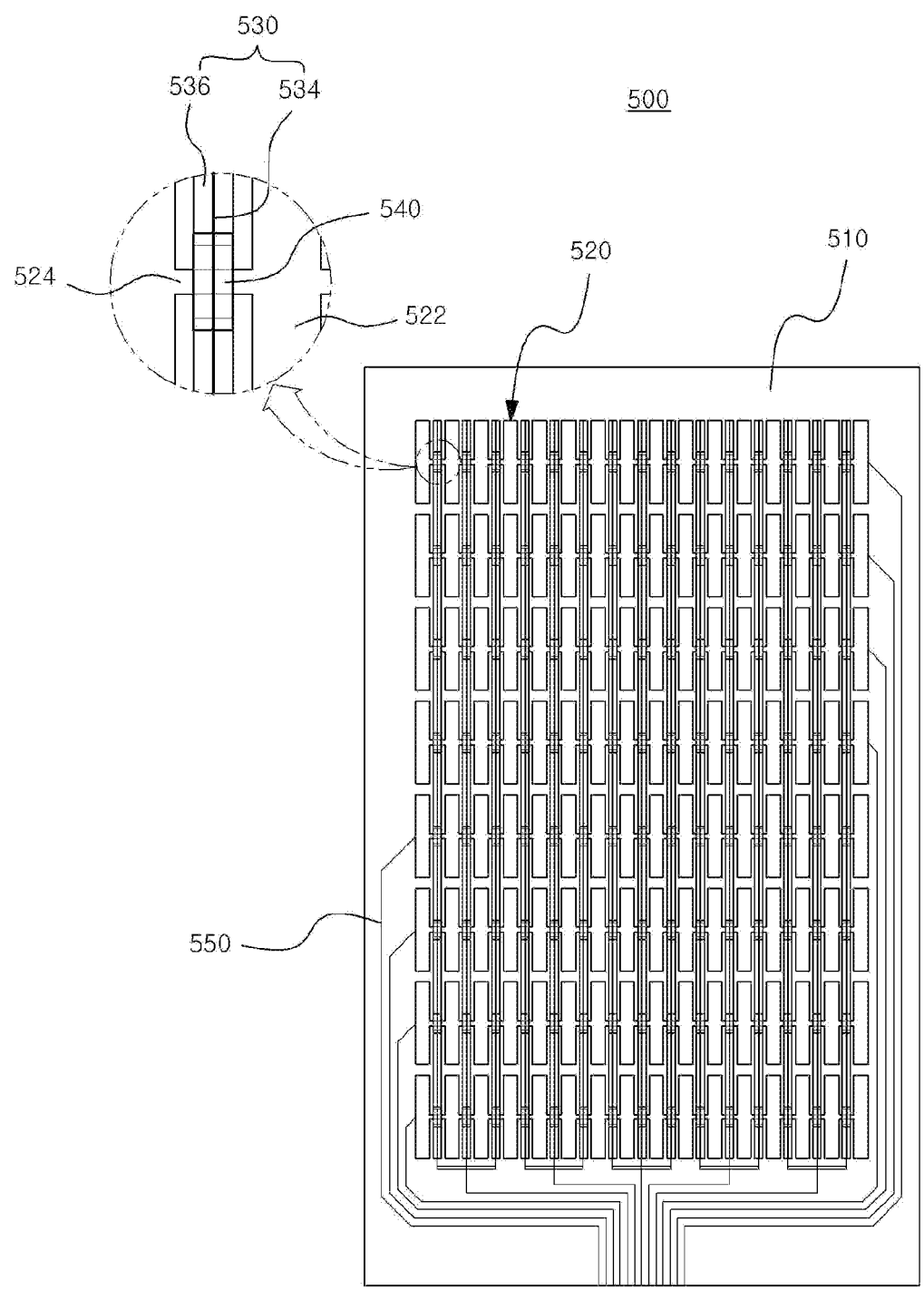
FIG. 17 is a plane view illustrating a touch panel sensor according to the fifth embodiment of this invention.

FIG. 17 is a plane view illustrating a touch panel sensor according to the fifth embodiment of this invention.

Referring to FIG. 17, a touch panel sensor 500 according to this embodiment comprises a transparent substrate 510, first electrode patterns 520 and second electrode patterns 530 formed on the substrate 510, and insulating patterns 540 interposed between the first electrode patterns 520 and the second electrode patterns 530.

The transparent substrate 510 may be formed using synthetic film or glass substrate, the first electrode patterns 520 include enlarged portion 522 and bridge portions 524, and the second electrode patterns 530 include a low-resist line 534 and transparent connections 536. Other descriptions for materials, structures and manufacturing can refer to the descriptions and the drawings for previous embodiments.

The second electrode patterns 530 include the low-resist line 534 and the transparent connections 536, which are aligned in one row. In this embodiment, two or more low-resist lines 534 are grouped to form an electrode, in which top or bottom ends of the low-resist lines are electrically connected. For example, 3 low-resist lines form a group to serve as an independent low-resist line. The low-resist lines 434 of FIG. 12 are arranged by a distance of about 5 mm, however, the low-resist lines 534 of this embodiment are arranged by a distance of about 1.7~1.0 mm, such that three of the lines 534 are electrically connected at top and bottom ends.

Two or more of the low-resist lines 534 are grouped to help in an instant calculation of the fingers precise position. The pattern lines are parallel connected, and each of the low-resist lines 534 in the same group is separated enough, so as to improve the sensitivity according to the changing of the capacitance.

Figure 18:
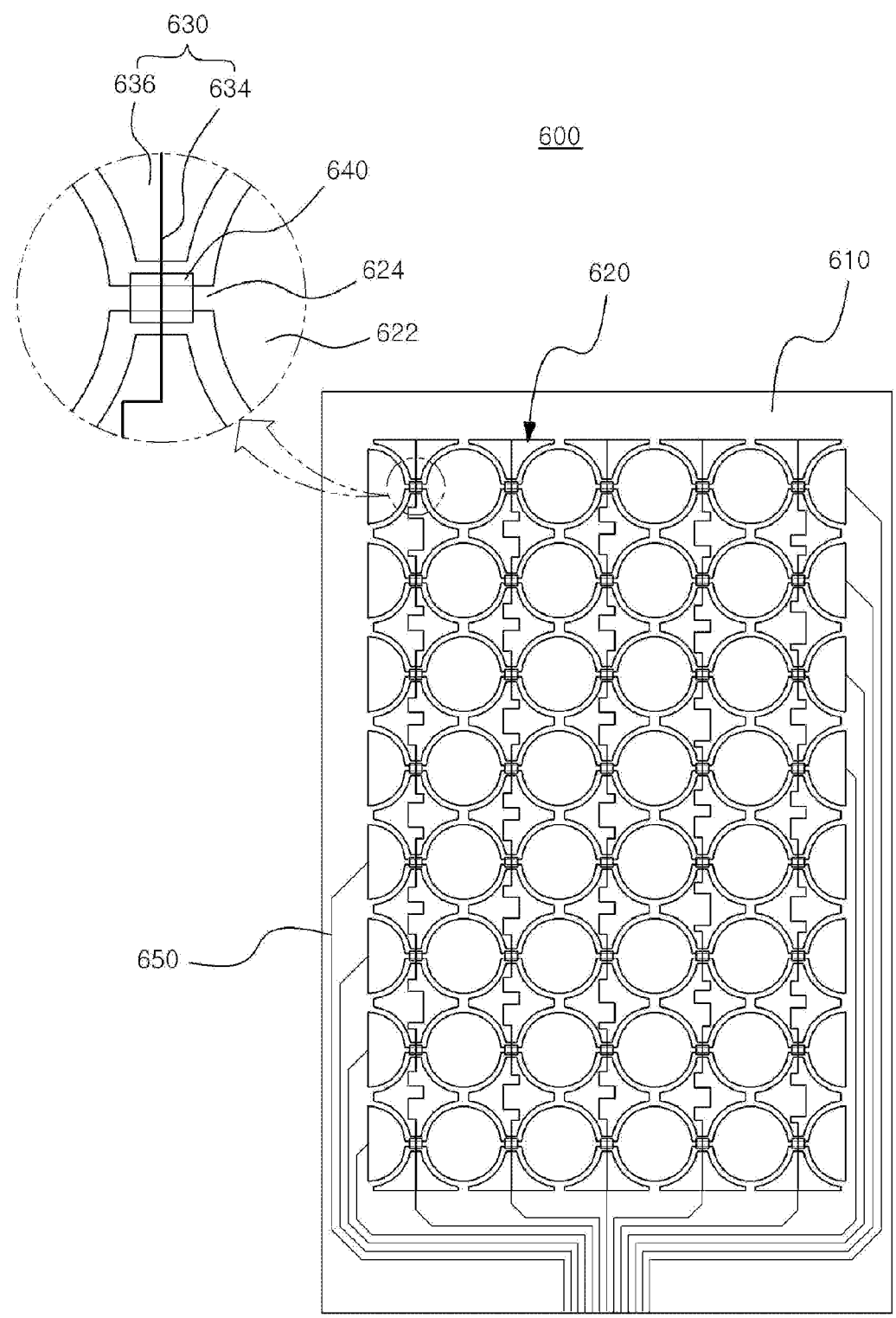
FIG. 18 is a plane view illustrating a touch panel sensor according to the sixth embodiment of this invention.

FIG. 18 is a plane view illustrating a touch panel sensor according to the sixth embodiment of this invention.

Referring to FIG. 18, a touch panel sensor 600 according to this embodiment comprises a transparent substrate 610, first electrode patterns 620 and second electrode patterns 630 formed on the substrate 610, and insulating patterns 640 interposed between the first electrode patterns 620 and the second electrode patterns 630.

The transparent substrate 610 may be formed using synthetic film or glass substrate, the first electrode patterns 620 include enlarged portion 622 and bridge portions 624, and the second electrode patterns 630 include a low-resist line 634 and transparent connections 636. Other descriptions for materials, structures and manufacturing can refer the descriptions and the drawings for previous embodiments.

As shown in FIG. 18, the enlarged portions 622 are formed in a shape of circle or oval, and the transparent connections 636 are formed in a shape having concave sides corresponding to the enlarged portions 622. The low-resist line 634 may be formed in a shape of an irregularly folded line on the transparent connections 636.

The first electrode patterns 620 and the transparent connections 636 are shaped for mutual harmony to be separated by minimum distance, such that they can reduce electromagnetic interference (EMI) and improve the sensitivity of the sensor.

Figure 19:
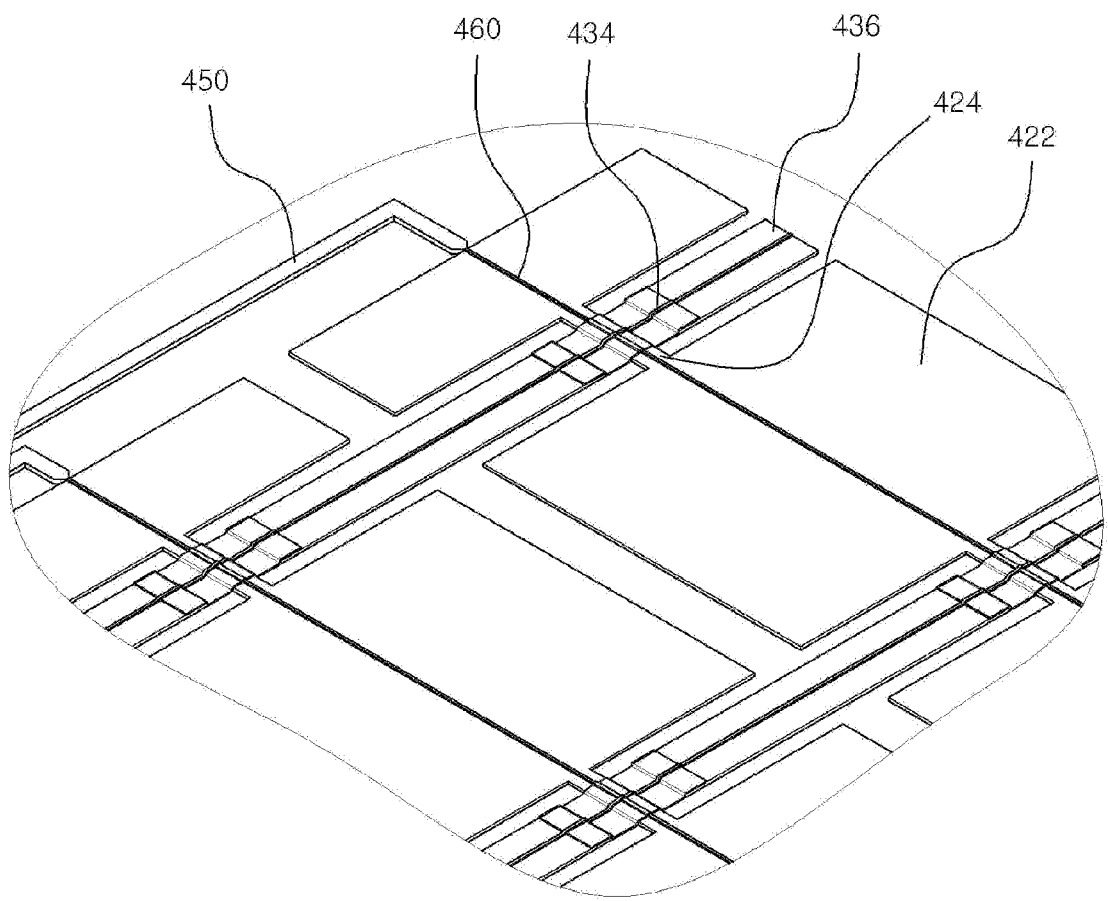
FIG. 19 is a partially enlarged perspective view illustrating a touch panel sensor according to the seventh embodiment of this invention.

FIG. 19 is a partially enlarged perspective view illustrating a touch panel sensor according to the seventh embodiment of this invention.

Referring to FIG. 19, the touch panel sensor of this embodiment further comprises low-resist patterns 460 formed on or in the first electrode patterns 420. The low-resist patterns 460 may be formed enlarged portions 422 or bridge portions 424, and may be formed using conductive material having a low resistance less than transparent conductive material like ITO. In this embodiment, the low-resist lines 434 and the low-resist patterns 460 may be formed using the same metal.

The low-resist patterns 460 may be formed horizontally along the first electrode patterns 420, so at to reduce total resistance of the first electrode patterns 420. The low-resist patterns 460 may be formed to have a thickness of less than 100 Å to permit light to pass through itself.

The low-resist patterns 460 may be formed in a shape of a straight line, otherwise, may be formed in a shape of a repeatedly curved or folded line, regularly or irregularly.

Figure 20:
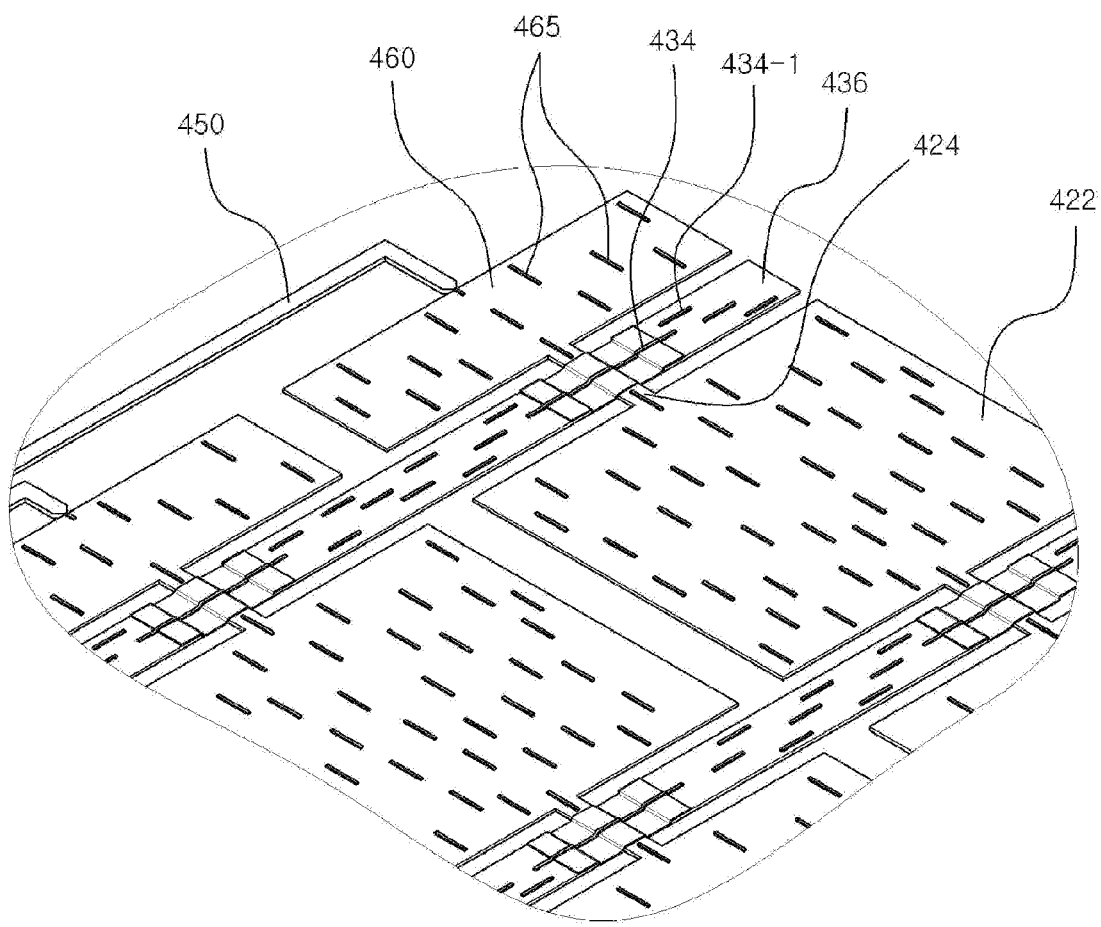
FIG. 20 is a partially enlarged perspective view illustrating a touch panel sensor according to the eighth embodiment of this invention.

FIG. 20 is a partially enlarged perspective view illustrating a touch panel sensor according to the eighth embodiment of this invention.

Referring to FIG. 20, the touch panel sensor of this embodiment further comprises low-resist patterns 465 arranged discontinuously on the first electrode patterns 420. The discontinuous low-resist patterns 465 may be formed on the enlarged portions 422 or the bridge portions 424, using conductive material having a low resistance less than transparent conductive material like ITO. Contrary to the low-resist pattern 460 of FIG. 19, the low-resist patterns 465 of this embodiment may be formed wholly or partially on a top or bottom side of the first electrode patterns 420.

The low-resist patterns 465 may be formed parallel to the first electrode patterns 420, or otherwise may be formed irregularly. The low-resist line 434-1 may be formed on the transparent connections discontinuously.

The low-resist patterns 465 and the low-resist lines 434-1 may work to reduce total resistance of the first electrode patterns 420 and the transparent connections 436, to be arranged or scattered on the low-resist members 465 and 434-1. Preferably, ends of each of the low-resist patterns 465 may be partially overlapped.

The discontinuously provided low-resist patterns 465 and low-resist lines 434-1 may be arranged regularly, however, according to the present embodiment, they may be provided irregularly for invisibility.

As the above mentioned, however the explanation refers to desirable exemplary embodiment of this invention, present invention may be comprehended to be modified and changed within the idea and domain of this invention reported in the claims to expert dealer in this technology.

INDUSTRIAL APPLICABILITY

The touch panel sensor of this invention can be used to a display module to sense a contact position of part of body.

The invention claimed is:

1. A touch panel sensor for sensing a contact position of part of body comprising:
   a substrate;
   a resist electrode part including resist electrodes formed on the substrate to have a capacitance changeable according to approaching of the part of body; and
   a signal electrode part including signal electrodes formed on the resist electrode having resistance coefficient less than the resist electrode.

2. The touch panel sensor of claim 1, wherein the signal electrodes are made of metal.

3. The touch panel sensor of claim 1, wherein the resist electrodes are made of transparent conductive material.

4. The touch panel sensor of claim 1, wherein the signal electrodes have a width less than the resist electrodes.

5. The touch panel sensor of claim 1, wherein the resist electrode part comprises first electrode patterns provided parallel on one surface of the substrate, and second electrode patterns provided perpendicular to the first electrode patterns on the same surface of the substrate, to be electrically separated from the first electrodes, The second electrode patterns having transparent connections formed separated from the first electrode patterns,
   the signal electrode part comprises a low-resist line formed on the transparent connections arranged in series, such that the low-resist line decreases the resistance of the second electrode patterns.

6. The touch panel sensor of claim 5, wherein an insulating layer or insulating patterns are formed between the first electrode patterns and the signal electrode part to electrically separate the first electrode patterns and the signal electrode part.

7. The touch panel sensor of claim 5, wherein the first electrode patterns include enlarged portions arranged in one row and bridge portions connecting the enlarged portions between the enlarged portions.

8. The touch panel sensor of claim 7, wherein the bridge portions are overlaid over or under the low-resist line.

9. The touch panel sensor of claim 1, wherein the signal electrode part is formed in a shape of a straight line, a regularly or irregularly curved line, or a regularly or irregularly folded line.

10. The touch panel sensor of claim 1, wherein the signal electrode part is provided on the resist electrode part, to have discontinuously interrupted electrode lines.

11. The touch panel sensor of claim 10, wherein the signal electrode part is formed irregularly.

12. The touch panel sensor of claim 1, wherein an optical absorption is formed on a top surface of the signal electrode part.

13. The touch panel sensor of claim 1, wherein two or more of the signal electrodes are electrically connected to form a group.

14. The touch panel sensor of claim 1, wherein the resist electrodes are arranged in one row on the substrate, each of the resist electrodes has a first nod pattern and a second nod pattern mutually adjacent but electrically separated, the resistance ratio between the first nod pattern and the second nod pattern in one of the resist electrodes is different from that in neighboring another resist electrode.

15. The touch panel sensor of claim 14, wherein the first nod pattern in one of the resist electrodes is electrically connected to another first nod pattern in neighboring another resist electrode, the area or the thickness of the first nod patterns increasing in order, and the second nod pattern in the one of the resist electrodes is electrically connected to another second nod pattern in the neighboring another resist electrode, the area or the thickness of the second nod patterns decreasing in order.

16. The touch panel sensor of claim 1, wherein the resist electrodes are provided parallel on the substrate, each of the resist electrodes having a gradually changing width.

17. A method of manufacturing a touch panel sensor for sensing a contact position of part of body comprising:

providing a resist electrode part including resist electrodes formed on a substrate to have a capacitance changeable according to approaching of the part of body; and providing a signal electrode part including signal electrodes formed above the resist electrode having resistance coefficient less than the resist electrodes.

18. The method of claim 17, wherein the signal electrode part is provided using metal.

19. The method of claim 17, wherein the resist electrode part is provided using transparent conductive material.

\* \* \* \* \*